United States Patent [19]

Dyakov et al.

[11] Patent Number: 4,485,451

[45] Date of Patent: Nov. 27, 1984

[54] SYSTEM FOR MONITORING DYNAMIC PARAMETERS OF MAGNETIC HEADS

[75] Inventors: Dobromir A. Dyakov; Petko V. Kodjabashev; Pejo Stanchev; Dimiter L. Kirov; Jivko J. Zelezov, all of Sofia; Atanas T. Atanassov; Krestyu N. Yanev, both of Stara Zagora, all of Bulgaria

[73] Assignee: Obedineni Zavodi Za Zapametyavashti Ustroystva, Stara Zagora, Bulgaria

[21] Appl. No.: 343,699

[22] Filed: Jan. 28, 1982

[51] Int. Cl.³ .................. G06F 15/20; G06F 11/16; G11C 5/08
[52] U.S. Cl. ...................... 364/551; 365/31; 365/69; 371/20
[58] Field of Search ............... 364/551, 550, 552, 556; 365/201; 360/6, 8, 31, 69; 371/15, 20, 25

[56] References Cited

U.S. PATENT DOCUMENTS

| | | | |
|---|---|---|---|
| 3,720,818 | 3/1973 | Spragg et al. | 364/552 |
| 3,774,154 | 11/1973 | Devore et al. | 365/201 |
| 3,984,763 | 10/1976 | Koester et al. | 360/31 |
| 4,217,636 | 8/1980 | Olmstead | 364/551 |
| 4,262,313 | 4/1981 | Mouri | 364/551 |
| 4,321,633 | 3/1982 | Saito | 360/69 |
| 4,404,603 | 9/1983 | Warren et al. | 360/31 |

Primary Examiner—Charles E. Atkinson
Assistant Examiner—Gary V. Harkcom
Attorney, Agent, or Firm—Karl F. Ross; Herbert Dubno

[57] ABSTRACT

A device for the determination of the dynamic characteristics of a magnetic recording and reproducing head utilizes a support for the head to be analyzed and a standard head which are juxtaposed with common carrier and are controlled by a microcomputer through interface and shift register circuitry to automatically print out the saturation and response characteristics of the analyzed head. If a defect is determined, the standard head is activated so that the system can automatically detect whether the defect is an artifact of the recording medium or is a defect in the analyzed head.

9 Claims, 10 Drawing Figures

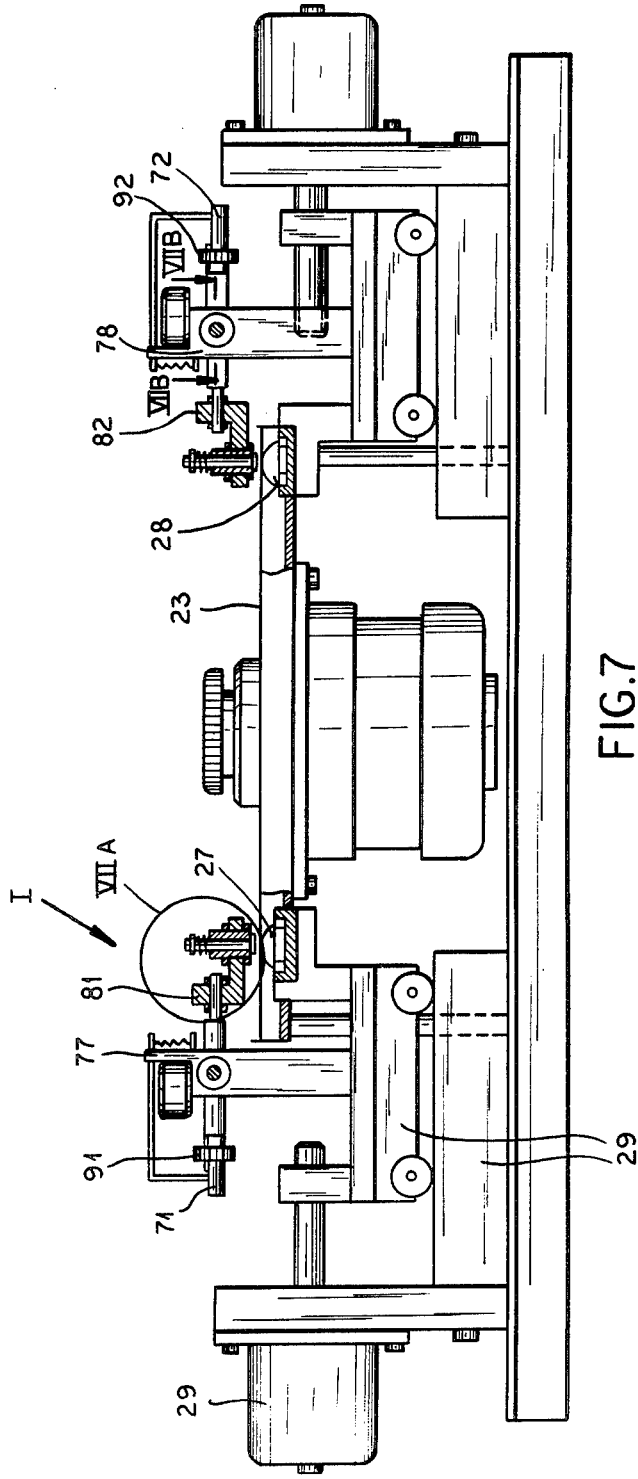
FIG.7
FIG.7A
FIG.7B

SYSTEM FOR MONITORING DYNAMIC PARAMETERS OF MAGNETIC HEADS

FIELD OF THE INVENTION

The invention relates to a device for monitoring or determining the dynamic parameters of magnetic recording and reproduction heads the device being useful in the development, manufacture and service of such heads.

BACKGROUND OF THE INVENTION

A known device measuring the dynamic parameters of magnetic heads is provided with a mechanical link setting the head into motion and with a circuit for the switching of the head which can be connected selectively with a pulse generator and a recording amplifier and with a reading amplifier, the output of which is connected to an oscilloscope.

By means of this device measurements are carried out by the respective commutation means in the control desk. All the measurement operations are made manually in the sense that the operator observes the successive measurements specific for the magnetic recording. The device comprises a mechanical measuring module on which the head can be mounted and from which the head is dismantled easily, as well as an electronic block with the circuits for control of the positioning and supply of the electric motors, the circuits supplying the current for recording and excitation of the head operating under conditions of recording, and circuits for the amplifying of the read signal. This device is completed by an oscilloscope. A microprocessor configuration with a universal and a particular use is known permitting to carry out arithmetic operation (universal use) as well as special-purpose controllers for the control of the respective processes (particular use).

The disadvantages of these existing devices are as follows: the selection of the functions to be measured is effected manually; the reading of the results by an oscilloscope is subjective; the filling in of the test result reports from the monitoring operation and the preparing of the certificate is manual; the device has no facility for active control during the operation so that faulty results may be obtained. The existing device requires manual regulation of the current for recording and saturation in a time-consuming procedure. The positioning of the difference paths is effected manually and relatively slowly. The measured values have to be memorized by the operator and the parameters have to be calculated subsequently.

OBJECT THE THE INVENTION

An object of this invention is to provide a device for characterizing the dynamic parameters of magnetic heads which will provide an active control of the operation, will automatically measure and will characterize the parameters and print them on the certificate, while having a keyboard for dialogue during the measurements.

SUMMARY OF THE INVENTION

According to the invention there is provided a device for characterizing the dynamic parameters of magnetic heads which comprises a microcomputer connected to a keyboard through a control unit and to a printer through a unit controlling its operation. The microcomputer is connected with a first parallel interface adapter comprising a first control register, a first data register, a second control register and a second data register as well as with a second parallel interface containing a first control register, a first data register, a second control register and second data register. The output CA2 for the total zeroing of the trigger of the first control register and the output CB2 for starting the measurement of the second control register of the first parallel interface adapter and the output CB2 for the current step of the second control register of the second parallel interface adapter are connected with the respective inputs of the input-output interface. The input CA1 for a complete analog-to-digital conversion of the first control register of the second parallel interface adapter is connected with a respective output of the input-output interface. The first and the second registers for data from the first parallel interface adapter are connected to the input-output interface. The output A7 for the operating conditions of the first register for data from the first parallel interface adapter and the output CA2 for the head step of the first control register of the second parallel interface adapter are connected with inputs of the input-output interface through a logic unit or circuit, through which are connected and outputs of the input-output interface to the input for the index CA1 of the first control of the first parallel interface adapter, to the input CB1 for readiness of the second control register of the first parallel interface adapter, the input B2 for index, the input for readiness of the disc B1 and the input B0 for readiness of the tester of the second register for data from the first parallel interface adapter, to the input CB1 for a head discharged at the second control register of the second parallel interface adapter. The input output interface is also connected in series with: the input of the pulse generator, the input of a circuit for switching the current on recording, the input of admitted data of a recorder amplifier, the control input of a circuit for switching analog signals, the input of a circuit for positioning a standard head, the output of the indexes of the measuring magnetic carrier, position sensors, the input of a circuit for positioning the head to be measured, the input for head selection of a circuit for switching the heads and the control input of a block controlling a shift register. The output of the circuit for switching the current on recording is connected with the input for current of the recording amplifier, the output of the latter is connected with the input for recording of the circuit for switching of the heads, with which are connected a standard head and the head to be measured, both connected with the measuring magnetic carrier and they are carried by respective positioning mechanisms, connected with the respective circuits for positioning. The reading output of the circuit for switching the heads is connected with a amplifier for reading, the output of which is connected with the information input of the circuit for switching of analog signals, the first analog output of which is connected with the input of a filter, its differentiating output—with the input of a peak detector and the second analog output—with one input of an integrating circuit, the second input of the latter being connected with the output of the filter. The output of the peak detector is connected with the synchronizing input of the control unit of the shift register, the time-step input of which is connected with the output of the pulse generator, with which is connected also the time-step input of a circuit for phase measuring. The control input of the circuit for the phase measurement is connected with one output of the control unit of a shift register, while its second output is connected with the control input of a shift register, one information input of which is connected with the output of the circuit for the phase measuring while the second information input is connected with the output of an analog-to-digital convertor, the input of which is connected with the output of an integrating circuit. The information output of the shift register is connected with the input of the first register for data of the second parallel interface adapter while to the input of the second register for data from the second parallel interface adapter is connected the time-prescribing output of a control console.

The logic unit contains a first inverter with an input from the output A7 for operating conditions of the first register for data from the first parallel interface adapter while its output is connected with the input-output interface and the input of a second inverter, the output of which is connected with the input-output interface and a first logic circuit "And", the second input of which is connected with a output for the index "measuring" of the input-output interface. The output of the first logic circuit "and" is connected with one input of a first logic circuit "Or", the output of which is connected with the inputs for index B2 of the second register for data and CA2 of the first control register from the first parallel interface adapter 1, while its second input is connected with the output of a second logic circuit "And", one input of which is connected with the output of the first inverter and its other input with on output for the index "standard" of the input-output interface. The logic unit comprises furthermore a third logic circuit "And", the inputs of which are connected respectively with the outputs for readiness of the disc and readiness of the tester from the input-output interface while its output is connected with the input for readiness of the second control register of the first parallel interface adapter. The output of the first inverter is connected further on with one of the input of a fourth logic circuit "And" and of a fifth logic circuit "And" while the second input of the fourth logic circuit "And" is connected with the output Ca1 for a step of the head of the first control register of the second parallel interface adapter with which is connected also one input of a sixth logic circuit "And", the second input of which is connected with the output of the second inverter while the second input of the fifth logic circuit "And" is connected with an output for a discharged standard head of the input-output interface. The output of the fifth logic circuit "And" is connected with one input of a second logic circuit "Or", the second input of which is connected with the output of a seventh logic circuit "And", one input of which is connected with the output of the second inverter and the other—with the output for a discharged measured head of the input-output interface.

The circuit for switching the current on recording comprises a current generator, the output of which is connected with the input of circuits for commutation from a commutation block the control inputs of which are connected with the outputs of a step counter having a first input from the output for total zeroing of the triggers of the input-output interface and a second input from a circuit for coincidence, the input of which are connected with the output for steps of the current and the output for measuring the saturation of the input-output interface.

The control unit for the shift register comprises a first trigger, the "R" and "D" inputs of which are connected with the output of the peak detector while its input "T" is connected with the output of the pulse generator. The direct output of the first trigger is connected with the input "D" of the second trigger, the input "T" of which is connected with the output of the pulse generator while its direct and its inverted outputs are connected with one input respectively of the first and the second logic circuit "And", the second inputs of which are connected respectively with the output for a current step of the input-output interface and with the direct output of the first trigger, with which is connected and the input "D" of a third trigger, the input "T" of the latter being connected with the output of the pulse generator. The direct output of the third trigger is connected with the "T"-input of a fourth trigger, the input of which is connected with a source of a logic unit, while its "R"-input is connected with the direct output of the first trigger. The output of the fourth trigger is connected with one input of a fifth trigger, the second input of the latter being connected through an inverter with the output of the pulse generator. Furthermore the input "S" of the second trigger is connected with an output for phase measuring of the input-output interface with which is connected also the input of the second inverter.

The shift register comprises ten registers connected in series, the control input of which are connected with the joint output of both logic circuits "And" of the control unit of the shift register while the information input of the first of the ten registers connected in series, is connected with an output of the first circuit "excluding or", one input of which is connected with the output of the circuit for phase measuring while the other is connected with the output of the first register. The input of the first register is connected with the output of a second circuit exclusive or, one input of which is connected with the output of a second register and the other—with the output of the analog-to-digital convertor with which is connected also the input of the second register. The first admitting inputs of both circuits exclusive or are connected with an output for phase measuring of the input-output-interface while the second two inputs are connected with the second inverter of the control block for the shift register. The control inputs of both registers are connected with the output for a current step of the input-output interface.

The phase measuring circuit comprises a two-step digital counter, one input of which is connected with the inverse output of the third trigger of the control block fort the shift register and the other input with the output of the pulse generator while its output is connected with the information input of a registor, the control input of which is connected with the inverse output of the first trigger of the control unit for the shift register.

The measuring module is provided with an standard head carried by a second positioning system connected electromagnetically with the flexible measuring carrier, the latter being pressed to the standard head and the measured head by means of levers placed through conic needles in comic thread supports, mounted by a freely sliding assembly in stands and fixed to them by nuts so that in one end of the levers on the side of the measuring flexible magnetic carrier by means of a freely sliding assembly are mounted L-shaped carriers fixed to them by nuts while the other part of the L-shaped carriers are mounted by a freely sliding assembly of threaded sleeves fixed to them by nuts, while in the threaded sleeves are placed heeled pins pressed to the measuring flexible carrier and on the other side of the levers are winded nuts with counter-weights.

The measuring flexible magnetic carrier which is placed in a special envelope-jacket is provided with a second slit and a second index opening.

The advantages of the device according to the invention are the active control during the measurements, the automatic measuring and characterizing of the parameters, the possiblity for printing the results in a report in the case of non-coincidence with the standards or as a certificate in the case of coincidence, the flexibility in the input of data or in changing the programming This device can be used for different sorts of magnetic heads.

BRIEF DESCRIPTION OF THE DRAWING

The device for characterizing the dynamic parameters of magnetic heads is described hereinafter with reference to the accompanying drawings in which

FIGS. 7, 7A and 7B are, respectively, an elevational view of a measuring module, partly broken away; a detail view of the region VIIA of FIG. 7; and a section along line VIIB—VIIB of FIG. 7.

SPECIFIC DESCRIPTION

Figure 1:
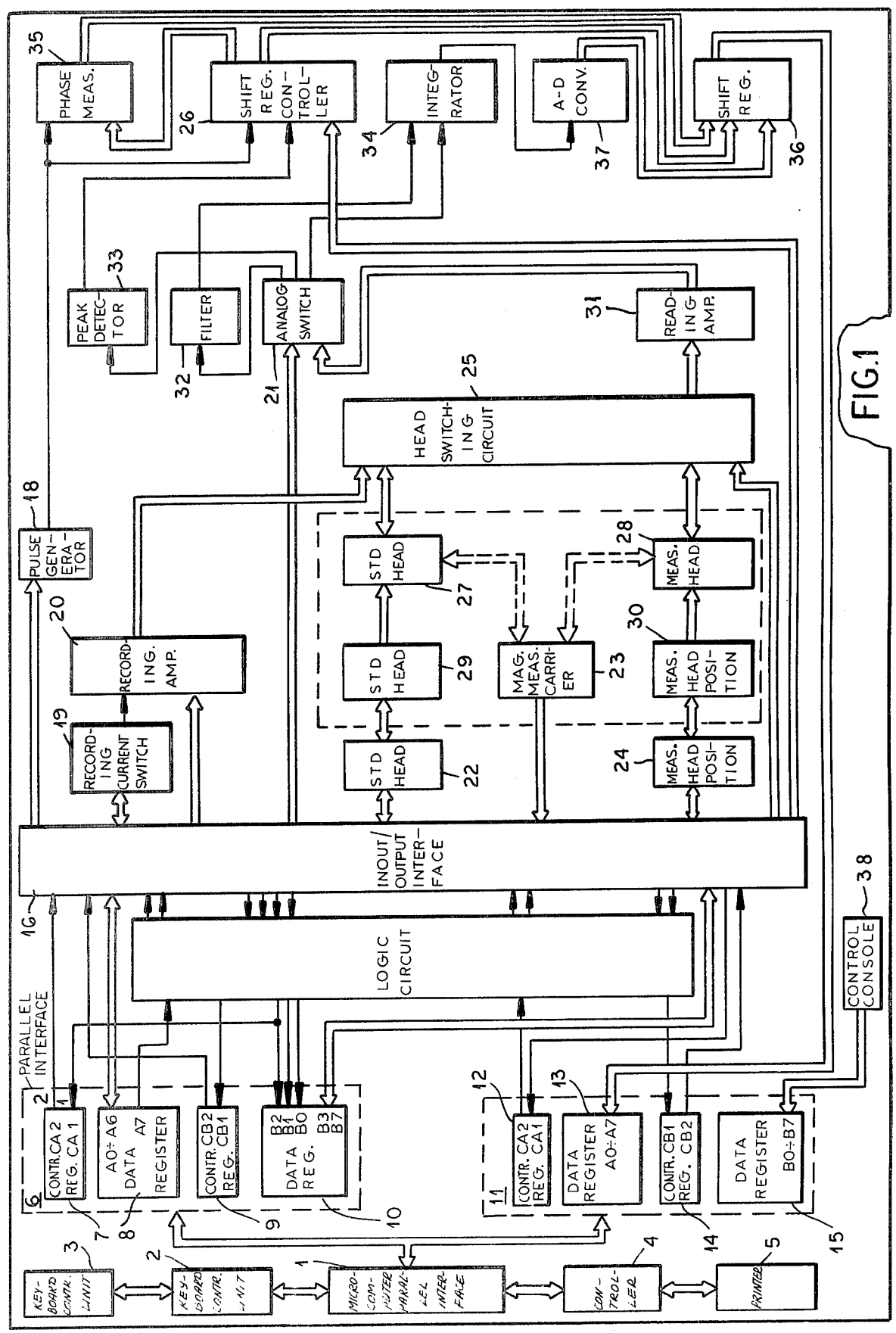
FIG. 1 is a block diagram of the device for characterizing the dynamic parameters of magnetic heads according to the invention

The device for characterizing the dynamic parameters of magnetic heads, as presented in FIG. 1 comprises a microcomputer 1 to which is connected through the keyboard control block unit 2 the keyboard 3 while through the printing control unit the printer 5 is connected to the microcomputer 1. To the microcomputer 1 is also connected a parallel interface adapter 6 comprising the first control register 7, the first data register 8, the second control register 9 and the second data register 10. The second parallel interface adapter 11 is connected to the microcomputer and comprises the first control register 12, the first data register 13, the second control register 14 and the second data register 15. The output CA2 for total zeroing the triggers of the first control register 7 and the output CB2 for starting the measuring of the second control register 9 of the parallel interface adapter 6 and the output CB2 for a current step of the second control register 14 of the second parallel interface adapter 11 are connected with the respective inputs of the input-output interface 16. The input CA1 for a completed analog-to-digital conversion of the first control register 12 of the second parallel interface adapter 11 is connected with a respective output of the input-output interface 16. Furthermore to the interface 16 are connected the first and the second data registers 8 and 10 of the first parallel interface adapter 6. The output A7 for the operating conditions of the data register 8 of the parallel interface adapter 6 and the output CA1 for a head step of the register 12 of the parallel interface adapter 11 are connected with inputs of the interface 16 through the logic circuit 17 while through it are connected also the outputs of the interface 16 to the input CA1 for the control register 7 of the parallel interface adapter 6, to the input CB1 for readiness of the control register 9 of the parallel interface adapter 6, the inputs B2 for index, for readiness of the disc B1 and readiness of the tester B0 of the data register 10 of the parallel interface adapter 6, to the input CB2 for a head, discharged in the control register 14 of the second parallel interface adapter 11. The interface 16 is connected with the input of the pulse generator 18, the input of a circuit for switching the recording current 19, the input of the admitted data of the recording amplifier 20, the control input of a circuit 21 for switching analog signals, the input of a circuit 23 for positioning of the standard head the index output of the magnetic measuring carrier 23, the input of a circuit 24 for positioning the measured head, the input for head selection in the circuit 25 for head switching and the control input of the control block for the shift register 26. The output of the circuit 19 for switching the recording current is connected with the input for the current of the recording amplifier 20, the output of which is connected with the record input of the circuit for switching the heads 25, with which are connected the standard head 27 and the measured head 28, both being connected with the measuring magnetic carrier 23 and carried by the respective positioning mechanisms 29 and 30, connected with the respective circuits for positioning 22 and 24. The reading output of the circuit for switching the heads 25 is connected with the reading amplifier 31, the output of which is connected with the information input of the circuit 21 for switching analog signals, the first analog output of which is connected with the input of the filter 32, its differentiated output is connected with the input of the peak detector 33 while the second analog output—with one input of the integrating circuit 34, the second input of which being connected with the output of the filter 32. The output of the detector 33 is connected with the synchronizing input of the control unit 26 for the shift register, the time-step input of which is connected with the output of the generator 18 with which is connected and the time-step input of the circuit 35 for phase measuring. The control input of the circuit 35 for phase measuring is connected with one output of the control unit 26 for the shift register, the second output of which connected with the control input of the shift register 36, one information input of which is connected with the output of the circuit for phase measuring 35 while the second information input is connected with the output of the analog-to-digital converter 37, the input of the latter is connected with the output of the integrating circuit 34. The information output of the shift register 36 is connected with the input of the data register 13 of the parallel interface adapter 11 while to the input of the data register 15 of the parallel interface adapter 11 is connected the time prescribing output of the control console 38.

Figure 2:
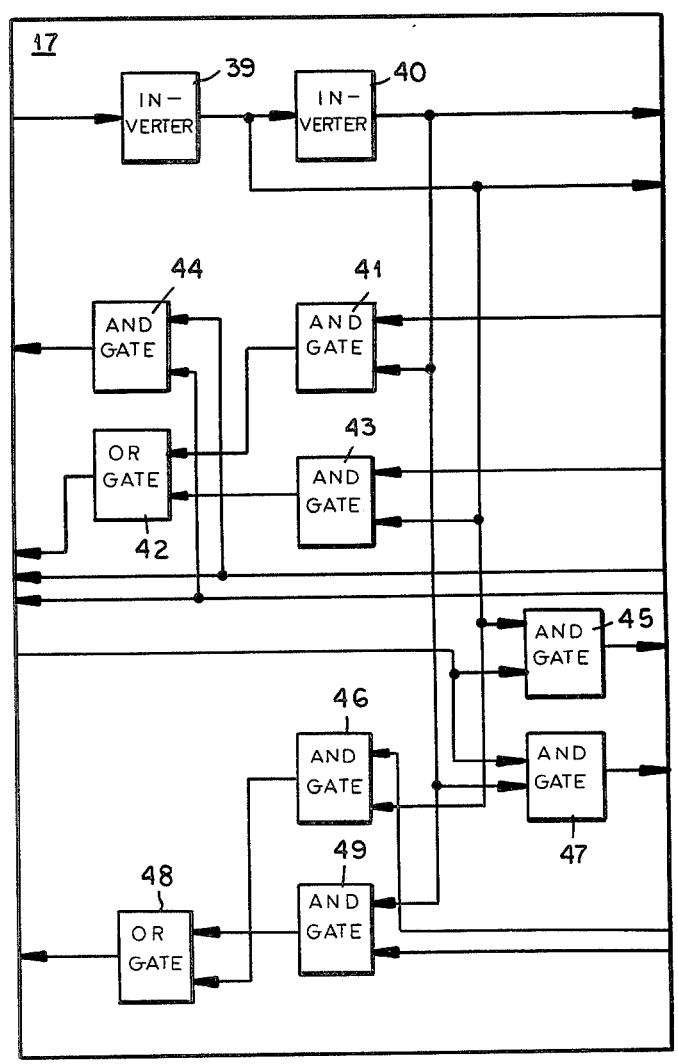
FIG. 2 is a structural diagram of the logic unit.

The logic circuit 17 (FIG. 2) comprises an inverter 39 with an input from the output A7 for the operating conditions of the data register 8 of the parallel interface adapter 6 while its output is connected with the interface 16 and the input of the inverter 40, the output of which is connected with the interface 16 and the logic "And" gate 41, the second input of which is connected with the output for the index "measuring" of the interface 16, so that the output of the "And" gate 41 is connected with one input of the "Or" gate 42, the output of which is connected with the inputs of index B2 of the data register 10 and the CA2 of the control register 7 of the parallel interface adapter 6 while its second input is connected with the output of "And" gate 43. One input of "And" gate 43 is connected with the output of the inverter 39, whereas the other is connected with an output for the index "standard" of the interface 16, so that the inputs of the "And" gate 44 are connected respectively with the output for readiness of the disc and readiness of the tester of the interface 16 while its output is connected with the input for readiness of the control register 9 of the parallel interface adapter 6. The output of the inverter 39 is connected also with one input of the "And" gate 45 and the "And" gate 46 whereas the second input of the "And" gate 45 is connected with the output CA2 for the head step of the first control register 12 of the parallel interface adapter 11 with which is connected also one input of "And" gate 47, the second input of which is connected with the output of the invertor 40. The second input of the "And" gate 46 is connected with the output for discharging of the standard head of the interface 16 whereas the output of circuit 46 is connected with one input of "OR" gate 48, the second input of which is connected with the output of "And" gate 49, one input of which is connected with the inverter 40 which the other is connected with the output for a discharged measured head of the interface 16

Figure 3:
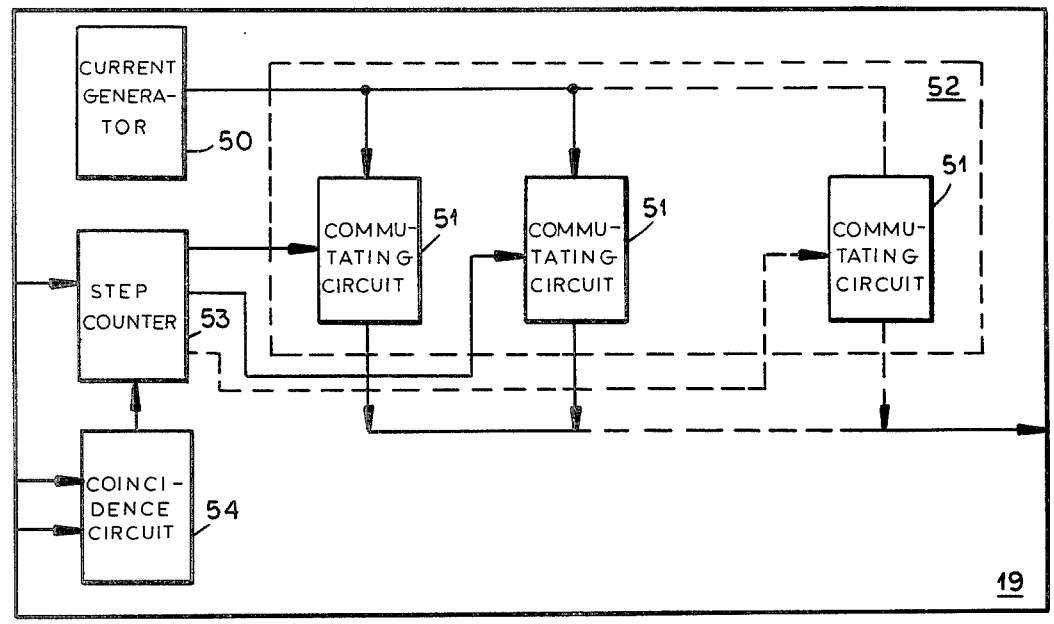
FIG. 3 is a block diagram of the circuit for switching the recording of current.

The circuit 19 (FIG. 3) for switching the current on recording comprises a current generator 50, the output of which is connected with the input of commutating circuits 51 of the commutating block 52, the control inputs of which are connected with the outputs of a step counter 53 having a first input from the output for total zeroing of the interface 16 triggers and a second input from the of coincidence circuit 54, the inputs of which are connected with the output for the current step and the output for measuring the saturation of the interface 16.

Figure 4:
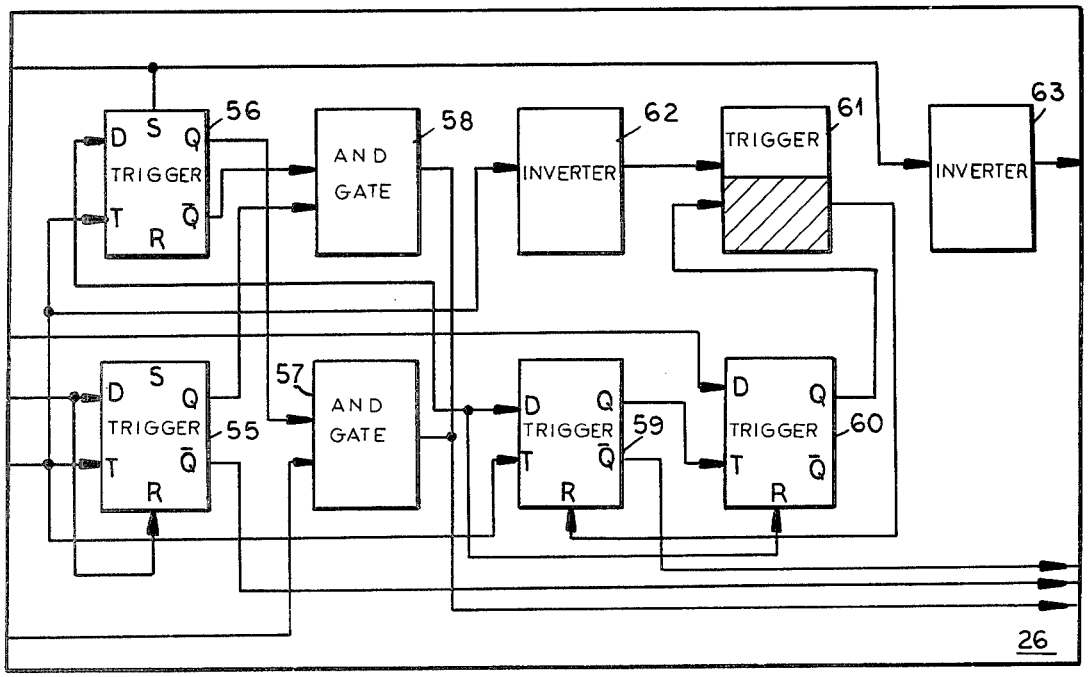
FIG. 4 is a unit diagram of the control block for the shift register.

The control unit 26 for the shift register (FIG. 4) comprises a trigger 55, the inputs "R" and "D" of which are connected with the output of the peak detector 33 while its T-input is connected with the output of the pulse generator 18 and the direct output of the trigger 55 is connected with the input "D" of the second trigger 56 the T-input of the latter being connected with the output of the pulse generator 18 whereas its direct and inverted outputs are connected with one input respectively of both logic circuits "And" 57 and 58, the second inputs of which are connected respectively with the output for the current step of interface 16 and with the direct output of trigger 55 with which is connected also the D-input of the trigger 59, the T-input of which is connected with the output of the pulse generator 18. The direct output of trigger 59 is connected with the T-input of trigger 60, the D-input of which is connected with a source of a logic unit and its R-input—with the direct output of trigger 55 whereas the output of trigger 60 is connected with one input of trigger 61, the second input of which is connected through the inverter 62 with the output of the pulse generator 18. Furthermore the S-input of trigger 56 is connected with an output for phase measuring of the interface 16 with which is connected also the input of the inverter 63.

Figure 5:
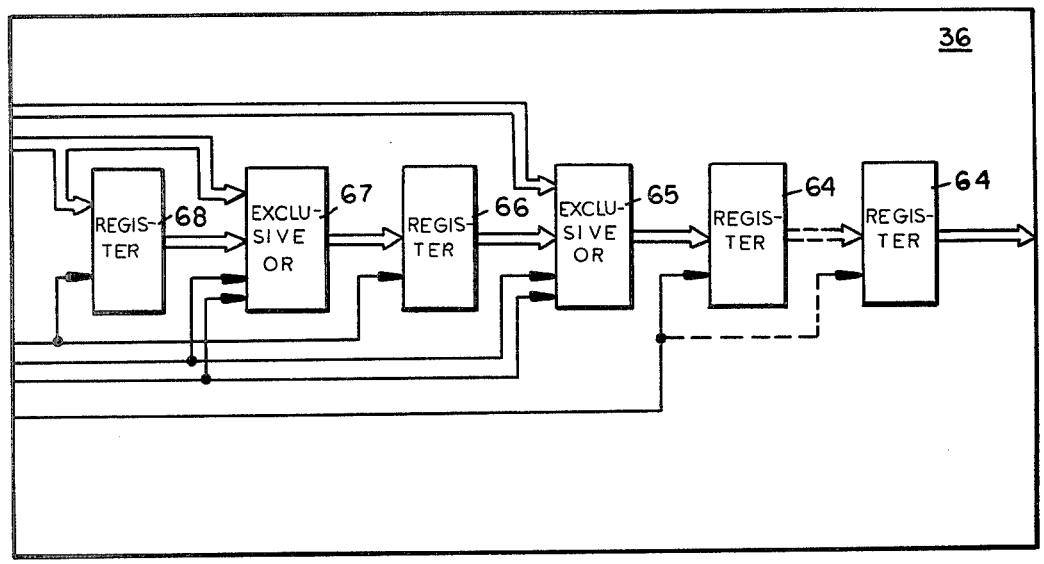
FIG. 5 is a block diagram of the shift register.
Figure 6:
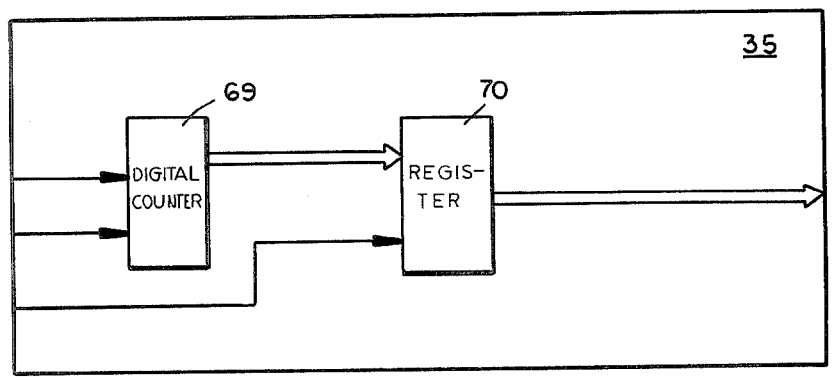
FIG. 6 represents the phase measuring circuit.

The shift register 36 (FIG. 5) comprises ten registers 64, . . . , 64 connected in series, the control input of which are connected with the joint output of both logic circuits "And" 57 and 58 of the shift register control unit 26 while the information input of the first of the ten registers 64 connected in series is connected with the output of the "exclusive or" circuit 65, one input of which is connected with the output of the phase measuring circuit 35 while the other is connected with the output of register 68 the input of which is connected with the output of exclusive OR circuit 67, one input of which is connected with the output of register 68 whereas the other is connected to the output of the analog-to-digital converter 37 with which is connected also the input of register 68. The first admitting inputs of the "exclusive OR" circuits 65 and 67 are connected with the output for phase measuring of the interface 16, while the second two are connected with the output of the inverter 63 of the shift register control unit 26 whereas the control inputs of both registers 66 and 68 are connected with the output for the current step of the interface 16.

The phase measuring circuit 35 comprises a two-step digital counter 69, one input of which is connected with the inverted output of trigger 59 of the control unit 26, the other input—with the output of the pulse generator 18 while its output is connected with the information input of register 70, the control input of which is connected with the inverted output of trigger 55 of the control block for the shift register 26.

The measuring module I (FIGS. 7, 7A, and 7B) having a standard head 27, carried by the positioning circuit 29, connected electromagnetically with a measuring flexible magnetic carrier 23, is pressed to the standard and the measured head respectively 27 and 28 by means of the levers 71 and 72 seated by pin-bearings 73 in thread-pins 75, mounted by a freely sliding assembly in stands 77 and 78 and fixed to them by nuts 79, whereas in one end of the levers 71 and 72 on the side of the measuring flexible magnetic carrier 23 are mounted by a freely sliding assembly L-shaped planks 81 and 82, fixed to them by nuts 83 while in the other part of the L-shaped planks 81 and 82 are mounted by a freely sliding assembly threaded sleeves 85 and 86, fixed to them by nuts 87; in the threaded sleeves 85 are seated heeled pins 89 which are pressed to the measuring flexible magnetic carrier 23 while on the other side of the levers 71 and 72 are winded nuts with counterweights 91 and 92.

Figure 8:
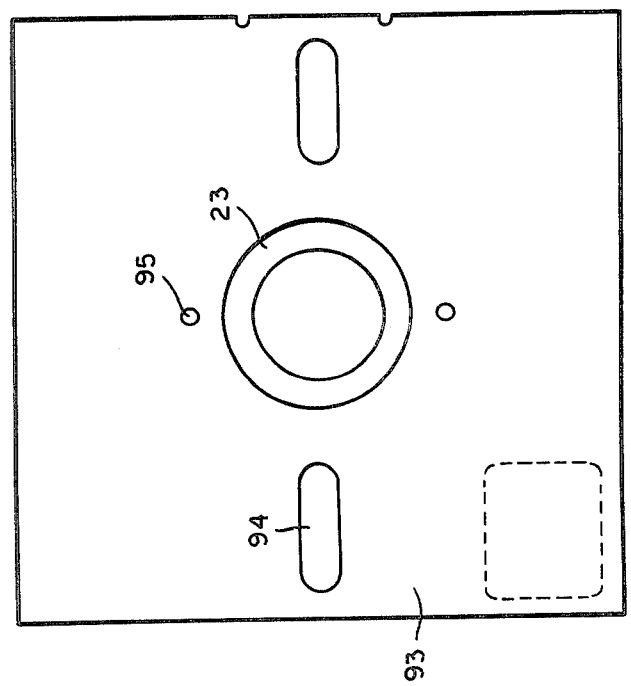
FIG. 8 is a measuring flexible magnetic carrier.

The measuring flexible magnetic carrier 23 which is placed in a special envelope-jacket 93 is provided with a second slot 94 and a second index opening 95 (FIG. 8).

The functioning of the device is as follows:

In the microcomputer 1 is recorded a hard program according to the algorithm for characterizing the respective type of heads. By means of the keyboard 5 and the controller 4 is introduced data, participating in the algorithm for measuring and characterizing. This data is being documented by the controller for printing 2 and the printing device 3. In starting the program by the keyboard 5, the measured head 28 is positioned on the respective positions by a signal step of head from the control register 12 of the parallel interface adapter 11, which is transmitted to a circuit for positioning 24 and starting the positioning 30. The measurement of the read amplitude is effected as follows: a signal for total zeroing of the triggers of the control register 7 of the parallel interface adapter 6 is tranmitted to the input-output interface 16 so that the nominal current for recording is being prepared. A recording is effected by a circuit for switching the current on recording 19, an amplifier for recording 20, a circuit for switching the heads 25 and the measured head 28. Further on is measured the amplitude obtained by the measured head 28 by means of a circuit for head switching 25, an amplifier for reading 31, a circuit for signal switching 21, a filter 32, an integrating circuit 34 and an analog-to-digital convertor 37. The obtained digital information by means of a shift register 37 under the control of the circuit for controlling the shift register 26 is transmitted to a data register 15 of the parallel interface adapter 11, from where it is perceived by the microprocessor.

The measuring of the phase is effected as follows: the output signal from an amplifier for reading 31 through the circuit for signal switching 21 and a peak detector 33 is transmitted to the control circuit of a shift register 26 which controls the initial and the final moment for measuring the phase of the signal. For this purpose is transmitted by the pulse generator 18 a completing frequence to the circuit for phase measuring 35. In attaining the phase end the circuit for controlling the shift register 26 transfers the obtained digital information from the circuit for phase measurement 35 to the shift register 36. The information is received by the microprocessor system in the same way as well as the measured amplitude. The measuring of the saturation current is effected as follows: by signals for a current step from the control register 14 of the parallel interface adapter 11 are transmitted pulses to the input-output interface 39, the respective output of which is connected with the circuit for switching the current on recording 19, which is regulating the current in the amplifier for recording 20. The current for recording through the circuit for switching the heads 25 is transmitted to the measured head 28. For every value of the current is received an output amplitude. The saturation current is obtained according to a program path depending on the measured amplitudes.

After the subsequent treatment of all data received is printed a certificate in the case of coincidence of the parameters and respectively a report in the case of non-concidence by means of a printing device 3.

If the program emits a signal for non-concidence of the magnetic coating of the carrier with the requested quality then is switched a diagnostic checking by the standard head 27, being positioned by a circuit for positioning 22 and putting into motion of the positioning 29 according to a method similar to this described for the measured head. All further measurements of the amplitude, phase and current of saturation are carried out as described hereinabove however by means of the standard head 27. The results from the measurements are not printed and if the parameters coincide is prepared a printed report; otherwise appears an information for defect of the magnetic carrier.

In the case of discharge of the heads 27 and 28 is received from the circuits for positioning 23 and 24 a signal for a discharged head to the control register 14 of the parallel interface adapter 11. In charging the heads, from the circuit for positioning of the heads 22 and 24 is received a signal for the operation path.

By means of the control desk 38 is effected a manual control of the times on the timers when recording the measurements.

The measuring module I (FIGS. 7, 7A) is tuned in the following order: the radial line of access of the standard and the measured heads 27 and 28 in respect to the axes of the measuring flexible magnetic carrier 23 is assumed and through nuts 79 and the conic threaded supports 75 are adjusted the levers 71 and 72 until their axes coincide with the radial line of access whereas by means of the nuts 83 are adjusted the L-shaped carriers 81 and 82 until the center of the axes of the heeled pins 89 coincide with the center of the axes of the standard and the measured heads 27 and 28 and further on are adjusted the threaded sleeves 85 through the nuts 87 until the plane of the heeled pins 89 contacting with the carrier 23 becomes perpendicular to the vertical axis of the heads and parallel to their base; then under the operational regime of recording-reading is effected a tuning according to the maximal read signal by turning the pin heels 89.

We claim:

1. A device for characterizing dynamic parameters of a magnetic head comprising, in combination;
    a support adapted to receive a flexible magnetic carrier and provided with respective means for mounting a standard head and a head to be analyzed in juxtaposition with said carrier; and
    a microcomputer-controller circuit for selectively exciting said heads and deriving data therefrom, said circuit including:
        a microcomputer provided with a keyboard for controlling said circuit and a printer for printing out data characteristic of the analyzed head,
        a pair of parallel interfaces connected with said microcomputer,
        an input/output interface connected with said parallel interfaces and with means for positioning said heads with respect to said carrier and with control circuits for recording and reading onto and from said carrier with said heads,
        a logic circuit between said parallel interfaces and said input/output interface for exchanging control signals between said parallel interfaces and said input/output interface,
        a head switching circuit for switching between said heads for routing information derived therefrom, and
        a shift register circuit controlled by said input/output interface for routing data from said head-switching circuit and said heads to said microcomputer for printing out thereby, whereby said printer prints out a certificate as to the performance of an analyzed head and upon detection of a defect, said standard head is activated to respond to said carrier and determine whether said defect is an artifact of said carrier.

2. The device defined in claim 1 wherein a first of said parallel interfaces comprises:
    a first control register receiving an input from said logic circuit and having an output to said input/output interface for total zeroing of triggering thereof,
    a data register exchanging data with said input/output interface,
    a second control register having an output for starting measurement thereof and an input from said logic circuit, and
    a second data register exchanging data with said input/output interface;
the other of said parallel interfaces comprises:
    a first control register having an output to said logic circuit and receiving an input from said input/output interface,
    a first data register for receiving data from said shift register circuit, a second control circuit receiving an input from said logic circuit and delivering an output to said input/output interface for a current step, and a second data register receiving information from a control console;

said head switching circuit comprises:

a pulse generator connected to said input/output interface, a recording current switching circuit connected to said input/output interface, a recording amplifier connected to said input/output interface and to said recording current switching circuit, a head switching unit connected to said recording amplifier, respective head positioners responsive to said input/output interface for displacing said heads under the control of said microcomputer, said heads being connected to said unit, a reading amplifier connected to said unit, an analog switch connected to said reading amplifier and operated in response to said input/output interface, said analog switch having first and second analog outputs and a differentiating output, and a filter connected with said first analog output, a peak detector connected with said differentiating output, and an integrator connected with said second analog output, said filter having an output connected to an input of said integrator; and said shift register circuit comprises:

a shift register controller receiving a time-step input from said pulse generator and having a first output, a phase measuring circuit receiving the time-step input from said pulse generator and connected to said first output of said shift register controller, a shift register having an information output connected to said first data register of said other parallel interface and receiving a first input from said phase measuring circuit, a second input from a second output of said shift register controller and a third input, and an analog digital converter connected to said third input of said shift register and receiving an input from said integrator.

3. The device defined in claim 2 wherein said logic circuit comprises:

a first inverter receiving an input from said first data register of said first parallel interface and having an output connected with said input/output interface, a second inverter having an input connected to said output of said first inverter and an output connected with said input/output interface, a first AND-circuit connected to said output of said second inverter, said input/output interface having an output for an index of measurement connected to another input of said first AND-gate, a first OR-gate connected to the output of said first AND-gate, said second data register and an input of said first control register of said first parallel interface having index inputs connected to the output of said first OR-gate, a second AND-gate having an output connected to an input of said first OR-gate and a first input connected with the output of said first inverter and with an index standard output of said input/output interface, a third AND-gate having inputs connected respectively with disc readiness and tester readiness outputs of said input/output interface and an output connected to a readiness input of said second control register of said first parallel interface, a fourth AND-gate having an input connected to the output of said first inverter, a fifth AND-gate having an input connected to the output of said first interter, another input of said fourth AND-gate being connected with a head-step output of said first control register of said other parallel interface, a sixth AND-gate having an input connected to said head-step output, a second input of said sixth AND-gate being connected with the output of said second inverter, a second OR-gate having one input connected to an output of said fifth AND-gate, and a seventh AND-gate having one input connected to the output of said second inverter, a second input connected to a discharged measuring head output of said input/output interface and an output connected to a second input of said second OR-gate, the output of said second OR-gate being connected to a discharged head input of said second control register of said other parallel interface.

4. The device defined in claim 2 wherein said recording current switching circuit comprises:

a current generator having an output, a plurality of commutating circuits having inputs connected with said output of said current generator and control inputs, a step counter having a first input from a total zeroing output of said input/output interface and a second input, the output of said step counter being applied to control inputs of said commutating circuits, and a coincidence circuit having inputs from a current step output and a saturation measuring output of said input/output interface and having an output connected to a second input of said step counter.

5. The device defined in claim 2 wherein said shift register controller comprises:

a first trigger having R- and D-inputs connected with the output of said peak detector and a T-input connected with the output of said pulse generator, a second trigger having a D-input connected with a direct output of said first trigger, a T-input connected with the output of said pulse generator and direct and inverted outputs connected respectively with inputs of first and second AND-gates whose second inputs are connected respectively with a current step output of said input/output interface and with a direct output of said first trigger, a third trigger having a D-input connected to the direct output of said first trigger, a T-input connected with the output of said pulse generator and a direct output connected with the T-input of a fourth trigger, the D-input of said fourth trigger being connected to a source of said logic circuit, the R-input of said fourth trigger being connected to the direct output of said first trigger, a fifth trigger having an input connected to the output of said fourth trigger, a second input connected through a first inverter with the output of said pulse generator, and a second inverter connected with a phase measuring output of said input/output interfact to which a S-input of said second trigger is connected.

6. The device defined in claim 5 wherein said phase-measuring circuit comprises a two-step digital counter, one input of which is connected with an inverted output of said third trigger and another input of which is connected with said pulse generator, a register having an information input connected with the output of said digital counter, a control input connected with the inverted output of said first trigger and an output connected with an exclusive OR-information input of said shift register.

7. The device defined in claim 2 wherein said shift register comprises ten registers connected in series and with logic circuits respectively connected thereto.

8. The device defined in claim 2 wherein said support is provided with respective levers swingably mounted on respective stands and disposed on a side of said carrier opposite said heads and having respective counterweights and adjustable fittings for pressing said carrier against said heads.

9. The device defined in claim 8 wherein said carrier is received in an envelope provided with windows through which said heads are juxtaposed with said carrier.

* * * * *

UNITED STATES PATENT AND TRADEMARK OFFICE
CERTIFICATE OF CORRECTION

PATENT NO. : 4,485,451
DATED : 27 November 1984
INVENTOR(S) : Dobromir A. DYAKOV et al It is certified that error appears in the above-identified patent and that said Letters Patent is hereby corrected as shown below:

In the heading, left column, item [75], for

"Pejo Stanchev" read -- Pejo Stanchev Zlatanev --.

Signed and Sealed this

Thirtieth Day of April 1985

[SEAL]

Attest:

DONALD J. QUIGG

Attesting Officer     Acting Commissioner of Patents and Trademarks